(12) United States Patent
Hsu et al.

(10) Patent No.: US 6,445,316 B1
(45) Date of Patent: Sep. 3, 2002

(54) UNIVERSAL IMPEDANCE CONTROL FOR WIDE RANGE LOADED SIGNALS

(75) Inventors: Jen-Tai Hsu, El Dorado Hills; Andrew M. Volk, Granite Bay, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/672,604

(22) Filed: Sep. 29, 2000

(51) Int. Cl.[7] .......................... H03M 1/48; H03M 1/10; H03M 1/06
(52) U.S. Cl. .................. 341/120; 341/118; 341/115
(58) Field of Search .................. 341/120, 119, 341/118, 117, 139, 115; 327/108; 358/426

(56) References Cited

U.S. PATENT DOCUMENTS 6,297,677 B1 * 10/2001 Ang et al. .................. 327/170

* cited by examiner

*Primary Examiner*—Peguy JeanPierre
*Assistant Examiner*—Jean Bruner Jeanglaude
(74) *Attorney, Agent, or Firm*—Blakely Sokoloff Taylor & Zafman LLP

(57) ABSTRACT

In one embodiment of the present invention, a compensation driving circuit includes a code generator, an enable circuit, and a driver. The code generator generates a driver code from a compensation code according to a selector signal. The driver code corresponds to a buffer having an impedance. The enable circuit enables the driver code. The driver controls impedance of the buffer according to the driver code.

30 Claims, 9 Drawing Sheets

US 6,445,316 B1

UNIVERSAL IMPEDANCE CONTROL FOR WIDE RANGE LOADED SIGNALS

BACKGROUND

1. Field of the Invention

This invention relates to digital circuits. In particular, the invention relates to impedance control.

2. Description of Related Art

Impedance controlled buffers are used in high-speed interfaces to improve signaling quality. Impedance of input/output (I/O) buffers changes with several factors including type of process, junction temperature, die temperature profile, noise, power supply fluctuations, device age, warm-up variations, etc. When a circuit involving I/O drivers is functioning, these changes in the impedance of the individual I/O drivers cause undesirable effects such as noise, reflections, crosstalk, ringing, overshoots and undershoots. The I/O buffer impedance can be controlled using analog or digital techniques. Digital control is the preferred method where compensation codes are used to compensate for any impedance mismatches at the pads of the I/O drivers. One method is referred to as resistor compensation (RCOMP) where an external reference resistor sets the impedance of the buffer. To maintain reasonable balanced impedance, compensation codes are recalculated and updated periodically.

Current techniques for updating compensation code are static in that the compensation codes are sent to the I/O drivers at a fixed, predetermined schedule. One approach is to update using a special reserved cycle (SRC). At designated times, the SRC is initiated, the transmission of data on the bus is stopped and the I/O drivers are tri-stated or put into an idle state. Then, the updated compensation codes are sent to the I/O drivers. This approach has a number of disadvantages. First, the transmission of data is temporarily suspended, resulting in a reduced transmission rate. Second, special circuitry is required to initiate the SRC. Third, the core of the device has to have some routing mechanism to route pending transactions into queues prior to code update. This approach therefore results in complex circuitry and degraded performance.

BRIEF DESCRIPTION OF THE DRAWINGS

The features and advantages of the present invention will become apparent from the following detailed description of the present invention in which.

DESCRIPTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
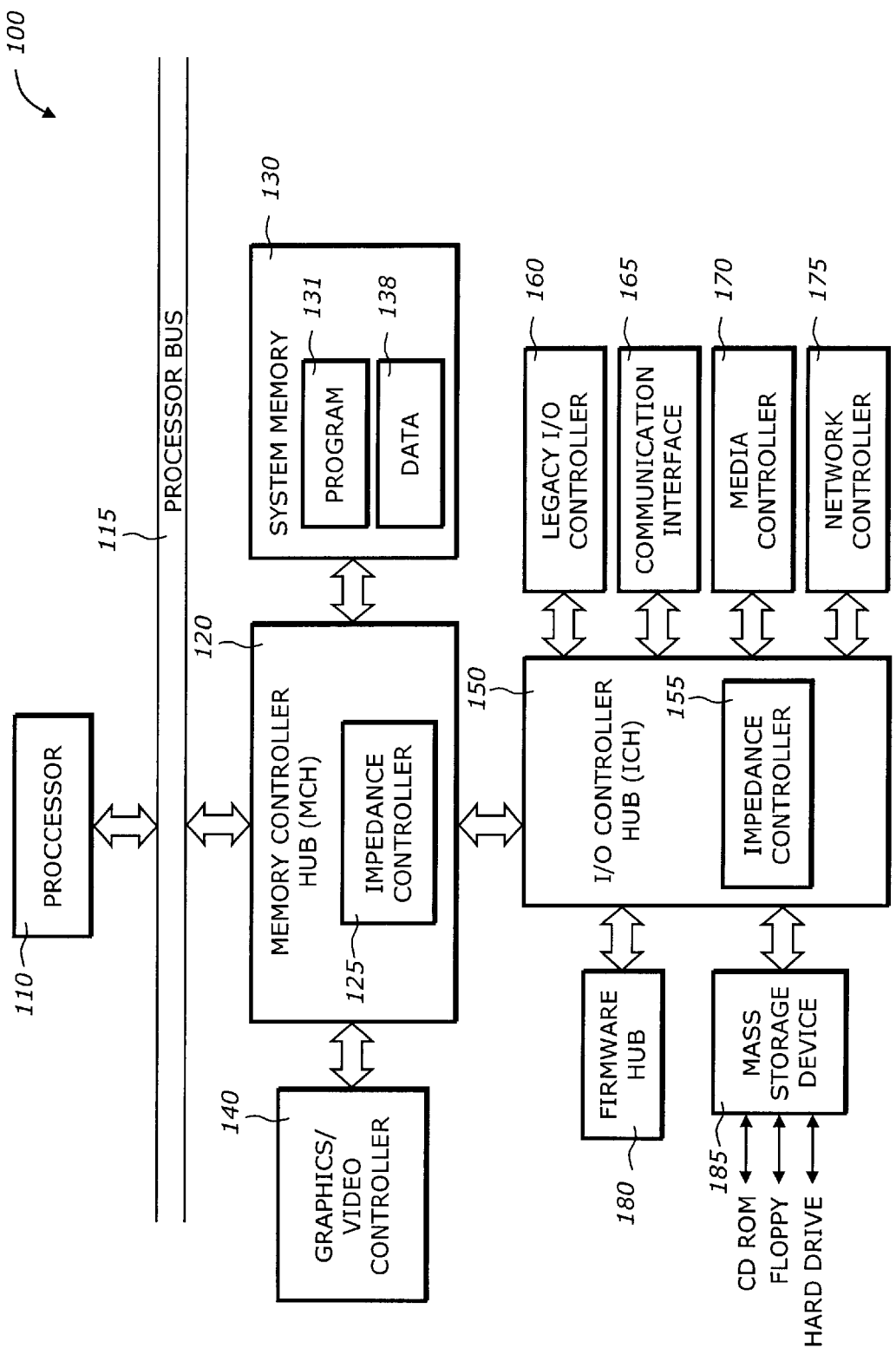
FIG. 1 is a diagram illustrating a system in which one embodiment of the invention can be practiced.

FIG. 1 is a diagram illustrating a system 100 in which one embodiment of the invention can be practiced. The system 100 includes a processor 110, a processor bus 115, a memory controller hub (MCH) 120, a system memory 130, a graphics/video controller 140, an input/output (I/O) controller hub (ICH) 150, a legacy I/O controller 160, a communication interface 165, a media controller 170, a network controller 175, a firmware hub 180, and a mass storage controller 185.

The processor 110 represents a central processing unit of any type of architecture, such as complex instruction set computers (CISC), reduced instruction set computers (RISC), very long instruction word (VLIW), or hybrid architecture. The processor 110 interfaces with the memory controller hub 120 via the processor bus 115. The processor bus 115 may support single processor or multiple processors.

The memory controller hub 120 and the I/O controller hub 150 typically form an integrated chipset which includes a number of interface circuits to allow the processor 110 access to the system memory 130 and peripheral devices. The memory controller hub 120 provides interface between the processor 110, the system memory 130, and other components in the system 100. The MCH 120 may contain one or more impedance controllers 125 to control impedance of buffers at each of the major interfaces.

The graphics/video controller 140 provides control of graphics and/or video information. The system memory 130 represents one or more mechanisms for storing information. For example, the system memory 130 may include non-volatile or volatile memories. Examples of these memories include flash memory, read only memory (ROM), or random access memory (RAM). The system memory 130 may contain a program 131 and other programs and data 138. Of course, the system memory 130 preferably contains additional software (not shown), which is not necessary to understanding the invention.

The I/O controller hub 150 provides interface to I/O or peripheral devices. The I/O controller hub 150 includes an impedance controller 155. The impedance controller 155 compensates the impedance at the bus drivers that drive a bus connecting to the memory controller hub 120, peripherals or I/O devices such as the peripheral component interconnect (PCI) bus. The legacy I/O controller 160 may include I/O devices such as parallel port, direct memory access (DMA) controller, timer, video controller, keyboard interface, entry device (e.g., mouse, trackball) interface. The communication interface 165 provides communication control such as serial communication interface, wireless devices, audio codec, modem codec, and universal serial bus (USB) devices. The media controller 170 provides control and interface to media devices such as audio and video equipment. The network controller 175 provides interface to network such as the Internet, local area network (LAN), and wide area network (WAN). The Internet provides access to on-line service providers, Web browsers, and other network channels. The firmware hub 180 may contain firmware such as Basic Input/Output System (BIOS), device drivers, etc. The mass storage controller 185 provides control and interface to mass storage devices such as CD-ROM, floppy diskettes, and hard drives. The mass storage device 185 provides access to computer readable media that contain program code and/or data to perform designated functions.

The impedance controller 125/155 may also be used in other devices or components in the system 100. For clarity purpose, the reference numeral 125 is used to refer to any impedance controller used in the system 100 or in any other digital circuits. Alternate embodiments of the impedance controller 125 may be used in microcontrollers, embedded processors, graphics devices, digital signal processors (DSP), and other types of logic circuits.

The compensation controller generates codes for use by a reference RCOMP driver against a known load. Those codes are held until the main interface drivers can be updated with the new codes. A set of latches sits between the compensation code outputs and the impedance control inputs of the interface buffers. Interfaces such as AGP require a reference resistor for each of the pull-ups and pull-downs to be calibrated. Typically, however, we only calibrate either the pull-up or pull-down against an external resistor. For example, the reference resistor is tied to Vcc and the pull-down is calibrated against it. An exact copy of the now calibrated pull-down is used as the reference for calibrating the pull-up. This is done with another RCOMP buffer, but one that is connected internally only and has no pad or external pin connection. Of course, the pull-up could be calibrated first against a reference resistor tied to ground and a copy used to calibrate the pull-down.

DDR uses a center-tapped termination (CTT) scheme that allows both pull-up and pull-down to be calibrated against the same reference resistor(s). This is the basis for most of the RCOMP schemes proposed here. If the RCOMP is on a separate pin, then the calibration cycle can be hidden and a complete calibration cycle run. However, it is also possible to use actual data or address pins for running the calibration cycle as long as a special receiver is included in the buffer used for calibration. In this case however, a complete cycle cannot be run every update as it would take too long. But this is rarely necessary, the buffer strength drifts very little in a short span of time and only incremental updates are necessary where the code incremented or decremented by one count per update. This can be done quickly and with little to no impact to system performance (during refresh cycles for instance).

Figure 2:
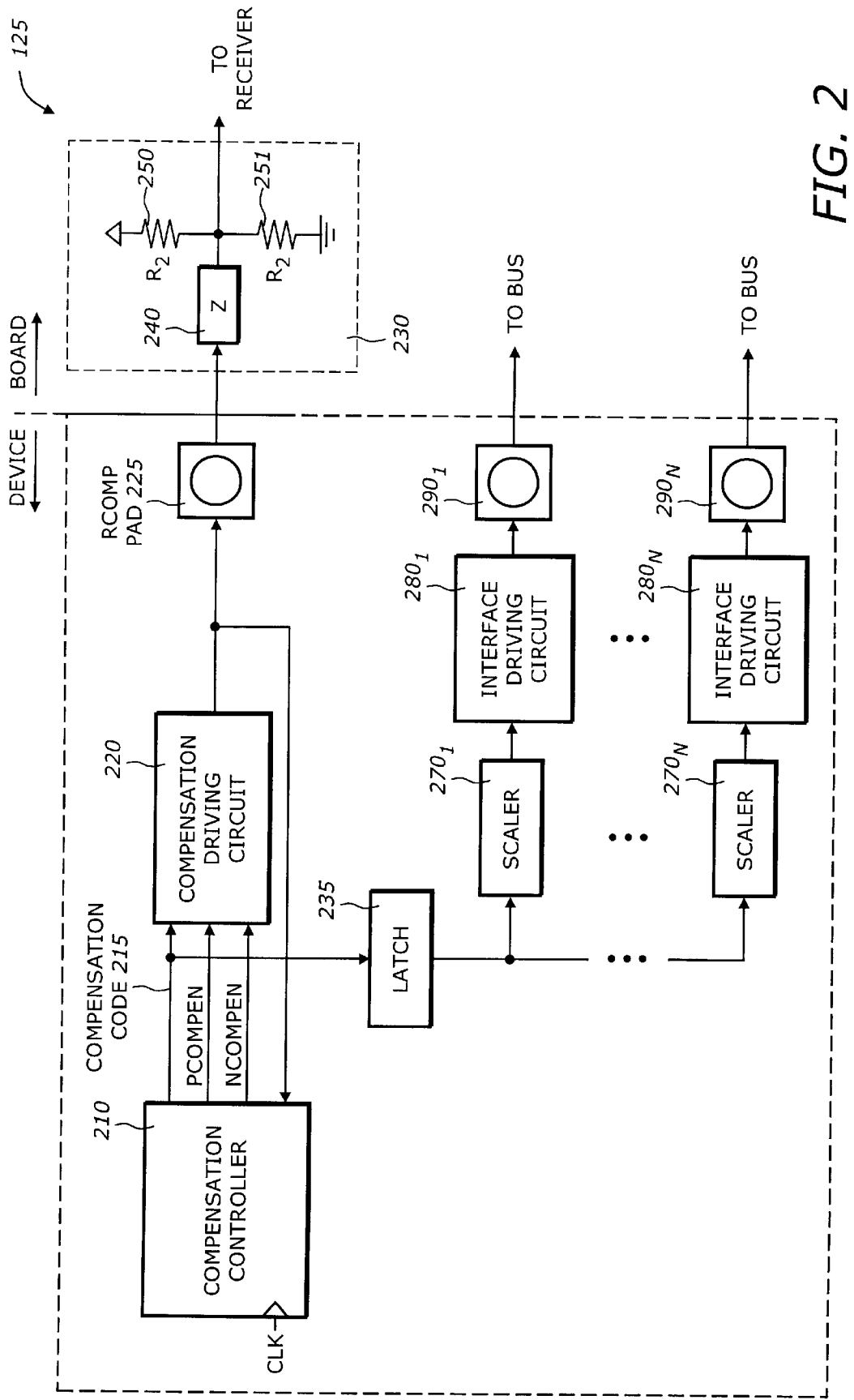
FIG. 2 is a diagram illustrating an impedance controller according to one embodiment of the invention.

FIG. 2 is a diagram illustrating an impedance controller 125 according to one embodiment of the invention. The impedance controller 125 includes a compensation controller 210, a compensation driving circuit 220, a compensation pad 225, a latch 235, N scalers $270_1$ to $270_N$, N interface driving circuits $280_1$ to $280_N$, and N interface pads $290_1$ to $290_N$. The impedance controller 125 is interfaced to the external circuits on board. A termination load 260 at the board interface includes a series impedance 240 and registers R1 260 and R2 251. The compensation driving circuit 220 drives reference resistor 250 on pad 225 to provide feedback information to compensation controller 210.

The compensation controller 210 uses the feedback information to update the compensation code synchronously with a clock signal CLK. The compensation controller 210 generates compensation code 215 to the compensation driving circuit 220. The impedance (strength) of interface I/O buffers 230 is set using the compensation code 215 from compensation controller 210. The code 215 is held in latch 235 while compensation controller 210 is in a recalibration cycle. The impedance of buffers is updated when latch 235 is opened. Latch 235 is opened when the change in the compensation code 215 will not affect interface performance or functionality. The N strength scalers $270_1$ to $270_N$ are used to change the impedance of the various groups of buffers at the corresponding interface pads $290_1$ to $290_N$ as required by the load on those groups. The interface driving circuits $280_1$ to $280_N$ include circuitry to drive the corresponding load at the bus. The compensation controller 210 generates control signals to the scalers $270_1$ to $270_N$ and the interface driving circuits $280_1$ to $280_N$. These control signals may include selector signals and enable signals (e.g., PINTEN and NINTEN) as described in FIG. 4B. DDR DRAM may have dramatically different loading conditions depending on different dual inline memory modules (DIMM)/SDRAM configurations. For example, for clock-per-clock (CPC) address signals, the loading can be as high as 112 pF (=3.5 pF/pin×8 pins/side×2 sides/DIMM×2 DIMMs) and can be as low as 20 pF (=5 pF/pin×2 pins/side×2 sides/DIMM). The heavily loaded signals include the address signals, the row address strobe (RAS#), and the column address strobe (CAS#), etc. The lightly loaded signals include data (DQ) and data strobe (DQS) signals, etc. For lightly loaded signals, the values for the series impedance 240 and the resistor 250 are typically 60 Ohms and 60 Ohms, respectively. For heavily loaded signals, the values for the series impedance 240 and the resistor 250 are typically 30 Ohms and 30 Ohms, respectively.

The compensation driving circuit 220 along with the N scalers $270_1$ to $270_N$ provide a universal mechanism to control the impedance for both lightly and heavily loaded signals without having separate control and driving circuits. The buffer 230, however, is scalable to provide the proper values.

Figure 3:
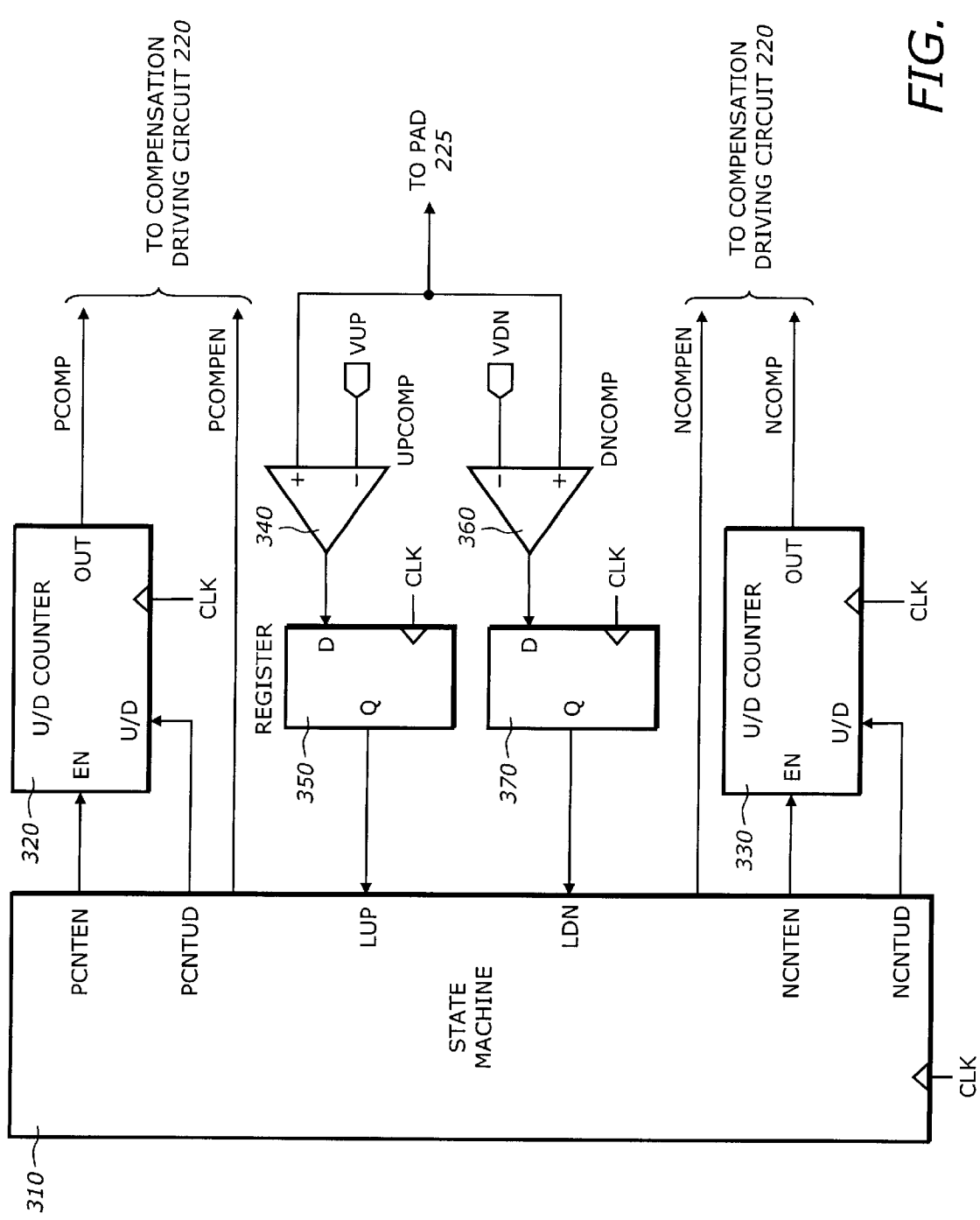
FIG. 3 is a diagram illustrating a compensation controller shown in FIG. 2 according to one embodiment of the invention.

FIG. 3 is a diagram illustrating a compensation controller 210 shown in FIG. 2 according to one embodiment of the invention. The compensation controller 210 includes a state machine 310, two up/down counters 320 and 330, an up comparator (UPCOMP) 340, a down comparator (DNCOMP) 360, and two registers 350 and 370.

The state machine 310 operates with the CLK signal to generate control signals to the up/down counters 320 and 330 and to the compensation driving circuit 220 (FIG. 2). The control signals include a p-counter enable (PCNTEN), a p-counter up/down (PCNTUD), a p-compensation enable (PCOMPEN), an n-counter enable (NCNTEN), an n-counter up/down (NCNTUD), and an n-compensation enable (NCOMPEN). The state machine 310 receives a latch up (LUP) and latch down (LDN) signals from the registers 350 and 370, respectively.

Figure 4A:
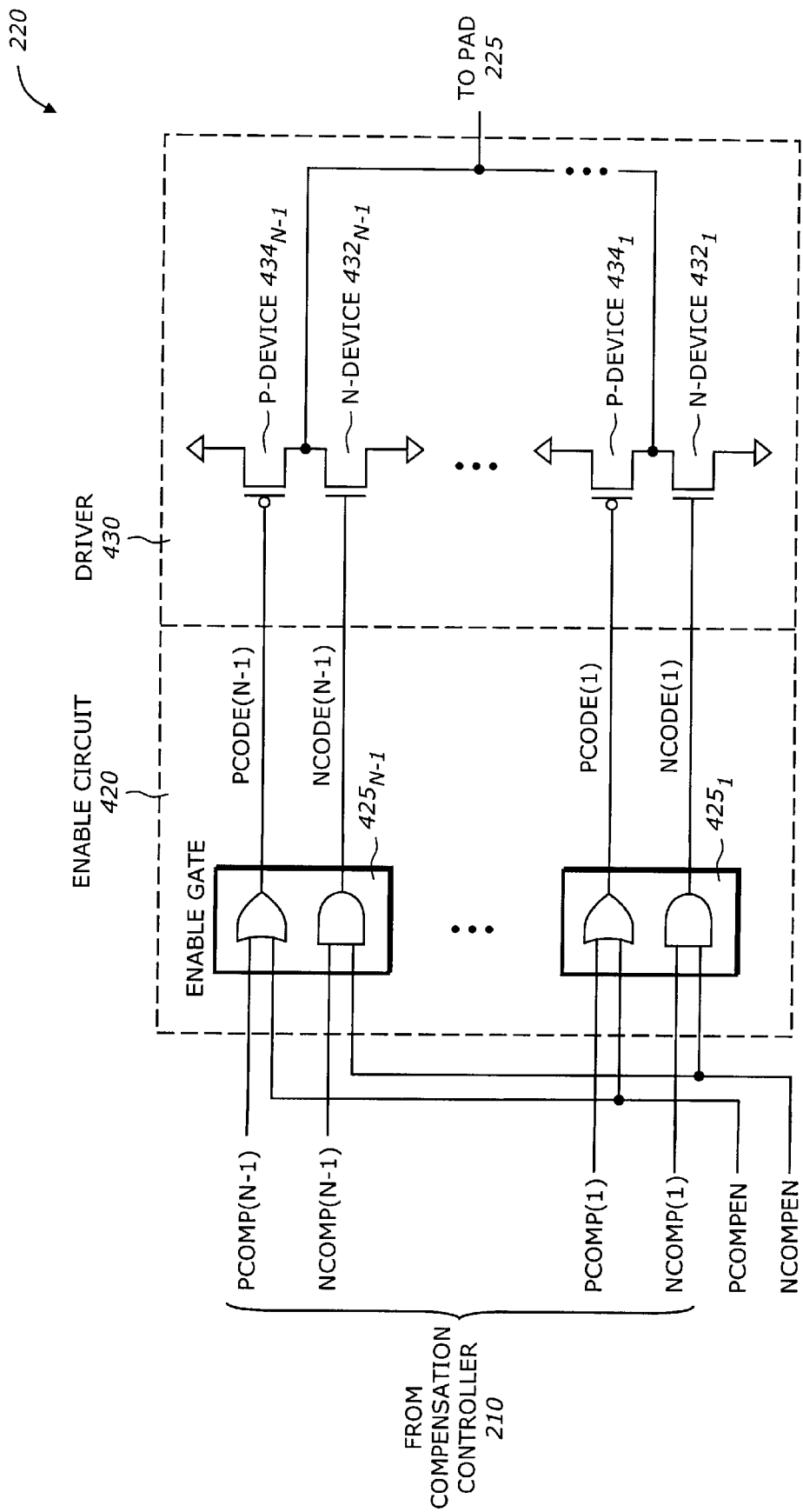
FIG. 4a is a diagram illustrating a compensation driving circuit shown in FIG. 2 according to one embodiment of the invention.

The up/down counters 320 and 330 count up or down to generate the corresponding compensation codes PCOMP and NCOMP to the compensation driving circuit 220. A typical driving circuit includes a number of pull-up and pull-down devices, as shown in FIG. 4A. In one embodiment, the pull-up device is a p-channel metal oxide semiconductor (PMOS), referred to as a p-device, and the pull-down device is an n-channel metal oxide semiconductor (NMOS), referred to as an n-device. A typical driver has a number of pull-up legs and pull-down legs. The PCOMP and NCOMP codes are for p- and n-devices at the driving circuit that drives the bus. The comparators 340 and 360 compare the voltage level at the pad 225 of the bus with the reference voltages VUP and VDN, respectively. The VUP and VDN reference voltages are the desired upper and lower buffer output swing levels, respectively. The registers 350 and 370 latch or clock the result of the comparisons to provide feedback information for the state machine 310 in the form of the LUP and LDN signals.

The p- and n-devices are enabled in turn. While the p-device is enabled by the PCOMPEN signal, the counter 320 is enabled by the PCNTEN signal to count up or down by the PCNTUP signal depending on whether the voltage at the pad 225 is higher or lower than the VUP reference voltage. Similarly, while the n-device is enabled by the NCOMEN signal, the counter 330 is enabled by the NCNTPEN signal to count up or down by the NCNTUP signal depending on whether the voltage at the pad 225 is higher or lower than the VDN reference voltage. The PCOMP and the NCOMP codes are thus generated to control the adjustment of p- and n-devices at the driving circuit. For example, as more legs of the p-devices are enabled, current can be conducted more strongly and the resistance is reduced.

Universal Compensation

FIG. 4A is a diagram illustrating a compensation driving circuit 220 shown in FIG. 2 according to one embodiment of the invention. The compensation driving circuit 220 includes an enable circuit 420 and a driver 430.

The enable circuit 420 is coupled to the compensation controller 210 to enable the compensation codes PCOMP and NCOMP 215. The enable circuit 420 generates a p-code (PCODE) and an n-code (NCODE) corresponding to p and n compensation codes PCOMP and NCOMP, respectively. The PCODE and the NCODE are used to drive the p- and n-devices in the driver 430, respectively. The PCODE and the NCODE are mutually exclusively enabled. In other words, when the PCODE is enabled, the NCODE is disabled turning off the corresponding n-devices in the driver 430, and vice versa. The enable circuit 420 includes N enable gates $425_1$ to $425_N$ to gate the PCOMP and NCOMP using the PCOMPEN and NCOMPEN signals from the state machine 310 (FIG. 3). In one embodiment, each of the N enable gates $425_1$ to $425_N$ includes an OR gate to enable/disable the PCODE and an AND gate to enable/disable the NCODE. For example, when the p-devices are enabled, the PCOMPEN signal is low and the NCOMPEN signal is low. A low on the PCOMPEN allows the DRVCODE to pass through the OR gates to become the PCODE while a low on the NCOMPEN generates all zero's for the NCODE through the AND gates, turning off the n-devices. Similarly, when the n-devices are enabled, the PCOMPEN and NCOMPEN signals are both high. A high on the PCOMPEN generates all one's through the OR gates, turning off all the p-devices while a high on the NCOMPEN allows the DRVCODE to pass through to become the NCODE through the AND gates.

The driver 430 is coupled to the enable circuit 420 to control impedance of the buffer 230 (FIG. 2) according to the PCOMP and NCOMP. The driver 430 includes a plurality of p-devices $434_1$ to $434_N$ to receive the p-code. The p-devices $434_1$ to $434_N$ drive the buffer 230 when the p-code is enabled. The driver 430 also includes a plurality of n-devices $432_1$ to $432_N$ to receive the n-code. The n-devices $432_1$ to $432_N$ drive the buffer 230 when the n-code is enabled.

Figure 4B:
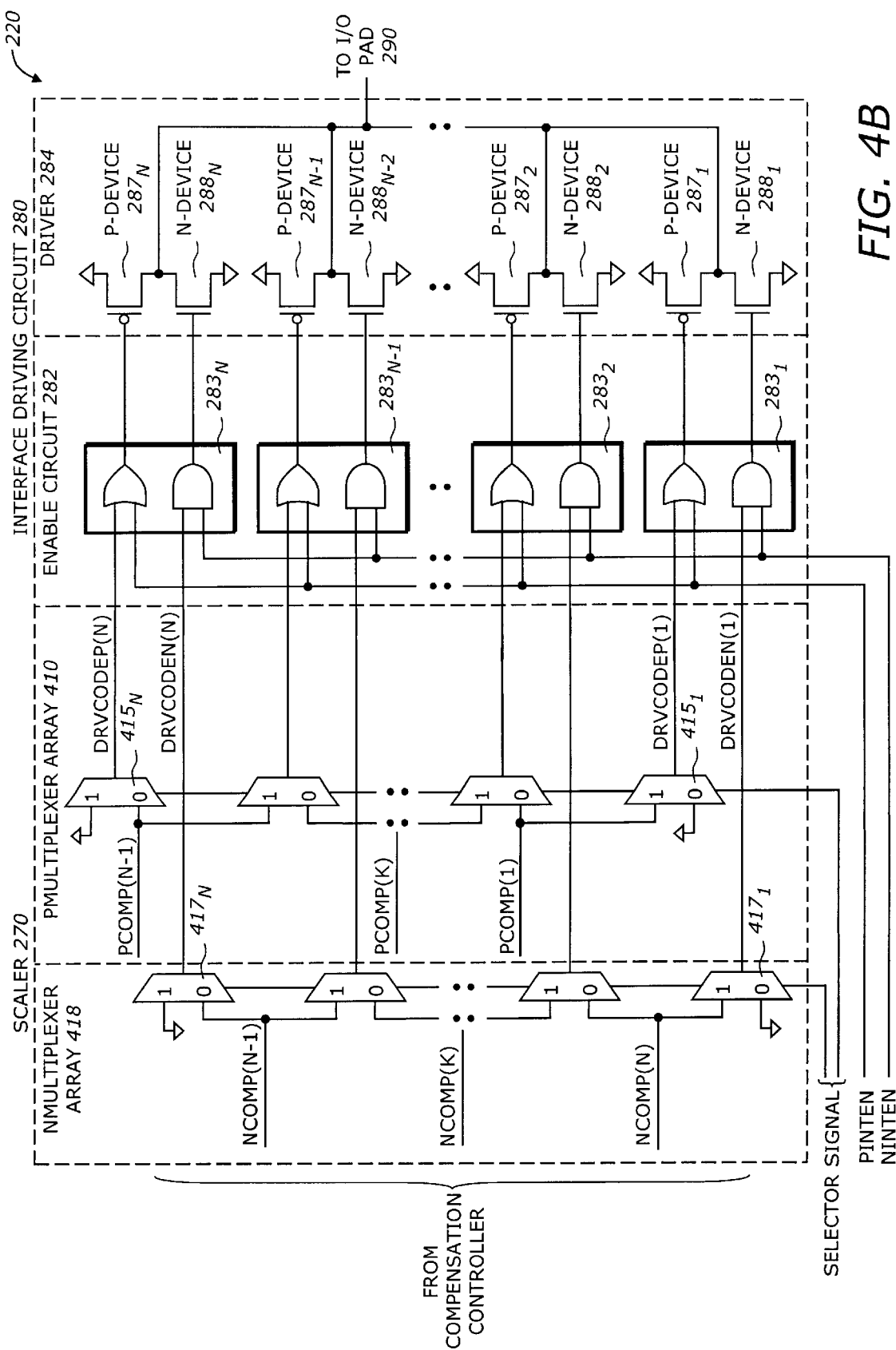
FIG. 4b is a diagram illustrating the interface I/O buffers shown in FIG. 2 according to one embodiment of the invention.

FIG. 4B is a diagram illustrating the scaler 270 and the interface driving circuit 280 shown in FIG. 2. The scaler 270 includes a p-multiplexer array 410 and an n-multiplexer array 418. The arrays 410 and 418 are essentially the same, except that the p multiplexer array 410 receives the PCOMP code while the multiplexer array 418 receives the NCOMP code. In the following, to simplify the discussion, only the array 410 is described in detail. The array 418 is similarly described. The interface driving circuit 280 includes an enable circuit 282 and an interface driver 284. The enable circuit 282 and the interface driver 284 are similar to the enable circuit 420 and the driver 430 in FIG. 4A, respectively.

The array 410 generates a driver code DRVCODEP from the compensation code PCOMP received from the compensation controller 210 (FIG. 3) and latched at the latch 235 (FIG. 2) according to a selector signal. The driver code DRVCODEP corresponds to the buffer at the pad 290 which has an impedance matched, or scaled, for heavily loaded or lightly loaded signals. The array 410 is used for both heavily and lightly loaded signals. The array 410 is a scaler to scale the compensation code PCOMP according to the selector signal. The scaled compensation code corresponds to the driver code DRVCODEP. The driver code DRVCODEP can be one of two values corresponding to the buffer impedances for the heavily and lightly loaded signals.

If there are N−1 compensation code lists in each of the PCOMP and NCOMP codes, then there are N multiplexers $415_1$ to $415_N$ and $425_1$ to $425_N$ in each of the arrays 410 and 418, respectively. The N multiplexers $415_1$ to $415_N$ include the least and most significant multiplexers $415_1$ and $415_N$ corresponding to the least and most significant bits of the (N−1) bits of the compensation code PCOMP. The N multiplexers $415_1$ to $415_N$ are controlled by the selector signal. The first and second inputs, indicated by the numbers 0 and 1 in FIG. 4B, of each of the N multiplexers $415_1$ to $415_N$ are selected when the selector signal is at low and high logic levels, respectively. The selector signal has two logic levels to select the driver code DRVCODEP corresponding to the two buffer impedances. Each of the N multiplexers $415_1$ to $415_N$ has first and second inputs, selected according to the first and second levels of the selector signal, respectively. The second input of each of the multiplexers other than the most significant multiplexer $415_N$ is connected to the first input of a next significant multiplexer and to a corresponding bit of the compensation code. The first input of the least significant multiplexer $415_1$ and the second input of the most significant multiplexer $415_N$ are connected to a logic level, e.g., zero (or ground level), to provide a scaling to the compensation code PCOMP, according to the selector signal. For example, if the compensation code PCOMP is 011100, then the DRVCODEP is 0011100 if the selector signal is at the high logic level, and is 0111000 if the selector is at the low logic level. Note that the DRVCODEP is scaled by a factor of 2, corresponding to a factor of 2 for the buffer impedance between the heavily loaded and lightly loaded signals. The use of a two input multiplexer in the array 410 to provide a scale factor of 2 is for illustrative purposes only. A more general scheme for other scale factors can be similarly derived. For example, an n-input multiplexer can be cascaded with proper connections to provide a scale factor equal or proportional to n. This scheme will accommodate a wide range of loaded signals.

The enable circuit 282 include n enable gates $283_1$ to $283_N$. Each of the enable gates enables the corresponding DRVCODEP and DRVCOPEN. The enabling is performed by the PINTEN and NINTEN signals generated from the state machine in the compensation controller 210. The driver 284 includes N p-devices $287_1$ to $287_N$ and N n-devices $288_1$ to $288_N$. The p-devices $287_1$ to $287_N$ and the n-devices $288_1$ to $288_N$ are controlled by the respective enabled DRV-CODEP and DRVCODEN.

The compensation driving circuit 220 and the scalers $270_1$ to $270_N$, and the interface driving circuits $280_1$ and $280_N$ therefore use the same circuit and the same compensation controller 210 to accommodate both the lightly loaded and heavily loaded signals. The buffer 230 is scalable to provide the appropriate buffer impedance for each case. The technique is universal, saving silicon area and reduces hardware complexity.

Figure 5:
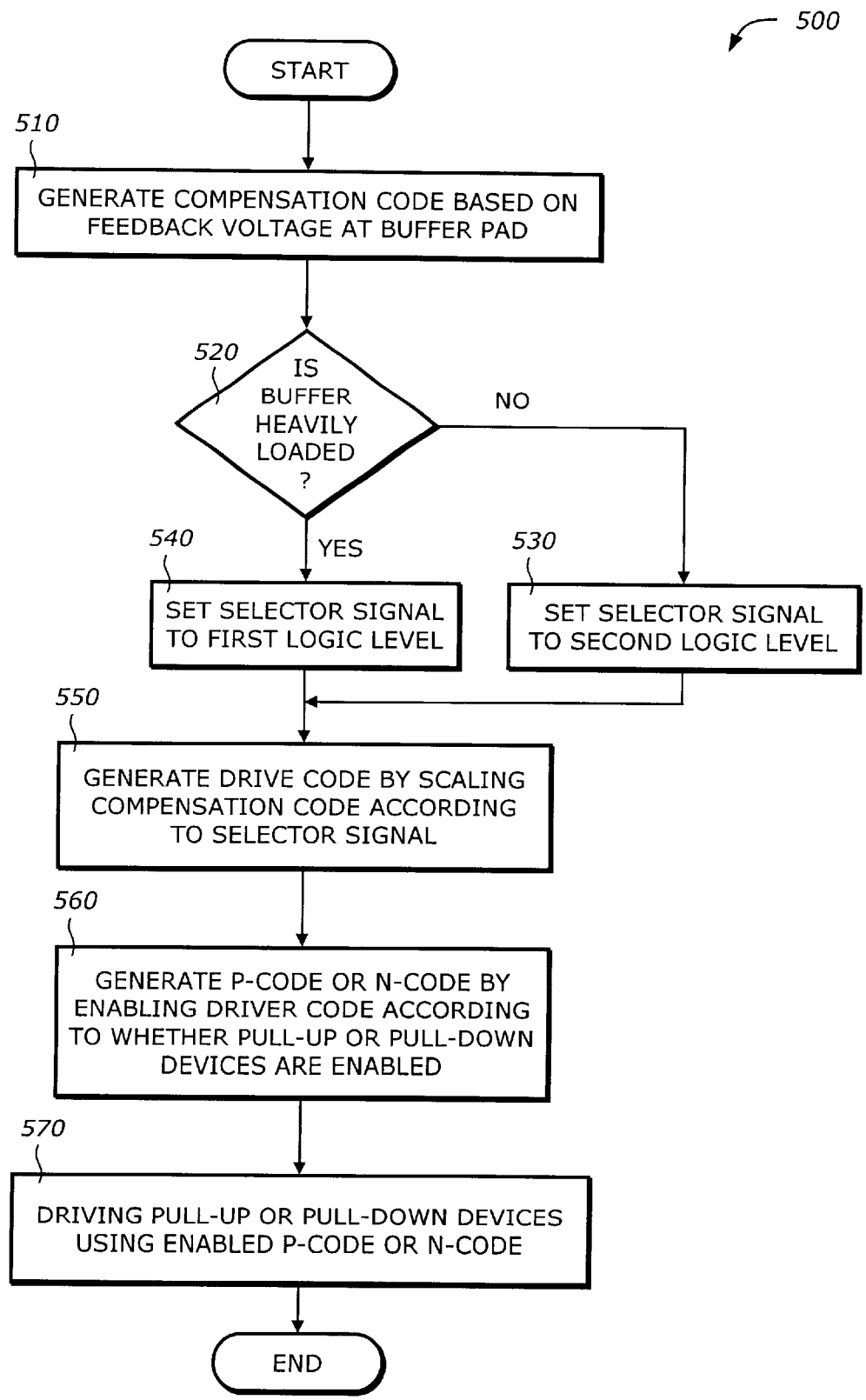
FIG. 5 is a flowchart illustrating a process to control impedance according to one embodiment of the invention.

FIG. 5 is a flowchart illustrating a process 500 to control impedance according to one embodiment of the invention. The process 500 corresponds to the embodiment in FIG. 4B.

Upon START, the process 500 generates the compensation code based on the feedback voltage at the buffer pad (Block 510). The compensation code may be generated by the state machine using the up down counters and the comparison result by comparing the feedback voltage with a reference voltage. Then, it is determined if the buffer is for heavily or lightly loaded signals (Block 520). If the buffer is for heavily loaded signal, the process 500 sets the selector signal to a first logic level, e.g., high, (Block 540). Otherwise, the process 500 sets the selector signal to a second logic level, e.g., low, (Block 530).

Next, the process 500 generates the interface I/O buffer driver code by scaling the compensation code according to the selector signal (Block 550). In one embodiment, the scaling is done by shifting the compensation code one bit up or down for a scale factor of 2. This is accomplished by switching a multiplexer array connected as a scaler. Then, the process 500 generates the p-code or the n-code by enabling the driver code according to whether the pull-up or the pull-down devices are enabled (Block 560). Next, the process drives the pull-up or the pull-down devices using the enabled p-code or n-code (Block 570). The process 500 is then terminated.

The embodiment shown in FIGS. 3, 4, and 5 uses a universal compensation driving circuit 220 to accommodate a wide range loaded signals including heavily and lightly loaded signals. This embodiment uses a code generator with a multiplexer array to generate a driver code according to the selector signal. The driver code is scaled according to whether the buffer is heavily loaded or lightly loaded as selected by the selector signal. The advantages of this embodiment include the sharing of the same strength bits calibrated by the same RCOMP state machine in the compensation controller that occupies the same pad slot and is calibrated at the same time. This embodiment needs a scalable buffer.

Another embodiment is to use separate RCOMP pads, one for heavily loaded signals and one for lightly loaded signals. In this embodiment, either two separate compensation controllers are used, or one compensation controller is shared by two RCOMP pads to perform compensation sequentially. This embodiment has an advantage that it does not require scalable buffers because the RCOMP pads deal with different loading conditions separately. In addition, the state machine in the compensation controller may be shared to save logic overhead.

Distributed RCOMP

For devices having wide bus interface such as the DDR SDRAM, the I/O buffers can be physically much further spread out than in other devices such as Accelerated Graphics Port (AGP) devices. In such wide bus architecture, the within-die process variation and temperature variation may affect the accuracy of the compensation. In addition, the wide bus includes different signal groups that have drastically different loading conditions. To accommodate this wide bus structure, a distributed methodology is useful.

Figure 6:
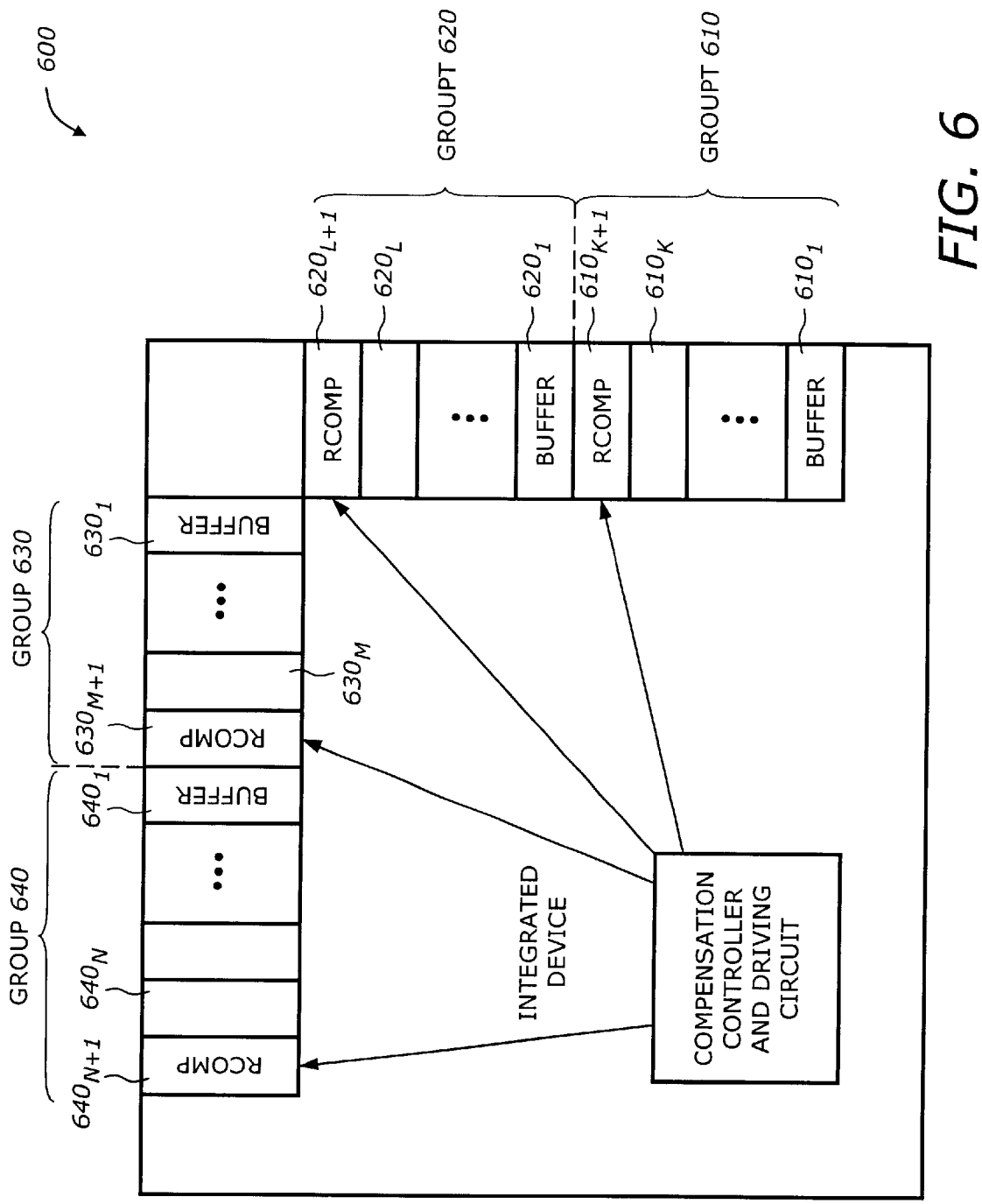
FIG. 6 is a diagram illustrating a device having a distributed RCOMP using multiple RCOMP buffers and pads according to one embodiment of the invention.

FIG. 6 is a diagram illustrating a device 600 having a distributed RCOMP using multiple RCOMP buffers and pads according to one embodiment of the invention. The device 600 includes four groups of buffers 610, 620, 630, and 640.

Each group has a number of buffers, e.g., DDR buffers, and an RCOMP buffer. Group 610 has K buffers $610_1$ to $610_K$ and an RCOMP buffer $610_{K+1}$. Group 620 has L buffers $610_1$ to $610_L$ and an RCOMP buffer $610_{L+1}$. Group 630 has M buffers $610_1$ to $610_M$ and an RCOMP buffer $610_{M+1}$. Group 640 has N buffers $610_1$ to $610_N$ and an RCOMP buffer $610_{N+1}$. K, L, M, and N are integers and may or may not be equal. In one embodiment, K=L=M=N=8, i.e., there is an RCOMP buffer and pad for each byte of data. For each group, different calibration is used depending on the loading conditions.

The impedance control for the distributed RCOMP shown in FIG. 6 can be performed in three ways using the general technique of the compensation control as shown in FIG. 3. The compensation controller 210 as shown in FIG. 3 can be used in a number of sharing configuration to save hardware. In the first method, the state machine 310 (FIG. 3) is shared by all the RCOMP circuitry in the device 600. In the second method, each RCOMP circuitry uses separate up/down counters 320 and 330. In the third method, the up/down counters 320 and 330 are shared but the comparators 340 and 360, and the registers 350 and 370 are used separately for each RCOMP circuitry.

Figure 7:
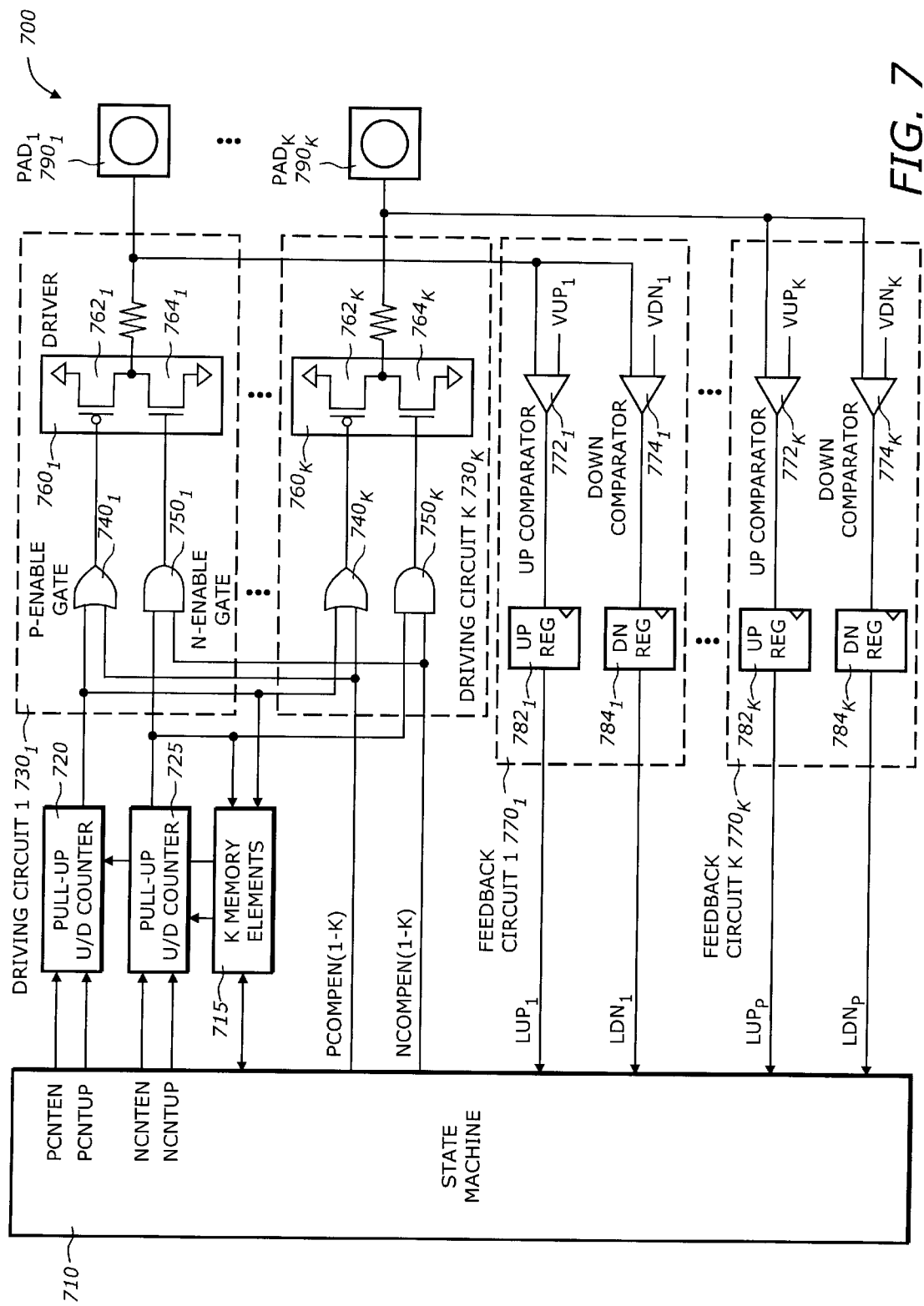
FIG. 7 is a diagram illustrating a compensation controller shared by multiple RCOMP buffers and pads according to one embodiment of the invention.

FIG. 7 is a diagram illustrating a compensation controller 700 shared by multiple RCOMP buffers and pads according to one embodiment of the invention. The compensation controller 700 is similar to the compensation controller 210 shown in FIG. 3 except that the driving circuit is included and the drivers, comparators, and registers are used distributively for multiple buffers and pads. The compensation controller 700 includes a state machine 710, a pull-up up/down counter 720, a pull-down up/down counter 725, K memory elements 715 K driving circuits $730_1$ to $730_K$, K feedback circuits $770_1$ to $770_K$ and K pads $790_1$ to $790_K$ p-enable gates $740_1$ to $740_K$, K n-enable gates $750_1$ to $750_K$, and K drivers $760_1$ to $760_K$. The K feedback circuits $770_1$ and $770_K$ include K up comparators $772_1$ to $772_K$, K down comparators $774_1$ to $774_K$, K up registers $782_1$ to $782_K$, and K down registers $784_1$ to $784_K$.

The state machine 710 is shared by all the K pads and buffers. The state machine 710 generates a PCNTEN signal to enable the pull-up counter 720, a PCNTUD signal to control the up/down counting mode of the pull-up counter 720, a NCNTEN signal to enable the pull-down counter 730, a NCNTUD to control the up/down counting mode for the pull-down counter 730, a PCOMPEN signal to enable the p-code generated from the pull-up counter 720, and the NCOMPEN signal to enable the n-code generated from the pull-down counter 730. Each of the buffers is enabled by a PCOMPEN and NCOMPEN. For K buffers, there are K PCOMPEN and NCOMPEN signals, denoted as PCOMPEN (1-K) and NCOMPEN (1-K) as shown in FIG. 7.

The pull-up counter 720 is an up/down counter to generate the p-code to the pull-up device, implemented as a p-device, in the driver $760_1$ to $760_K$. The pull-down counter 730 is an up/down counter to generate the n-code to the pull-down device, implemented as an n-device, in the driver $760_1$ to $760_K$. The K driving circuits $730_1$ and $730_K$ control the impedances of K buffers at the K pads $770_1$ to $770_K$ using the compensation code. The K feedback circuits $770_1$ to $770_K$ provide K comparison results for K voltage levels at the K pads $770_1$ to $770_K$. The K p-enable gates $740_1$ to $740_K$ and K n-enable gates $750_1$ to $750_K$ are used to enable the p-code and n-code respectively to drive the drivers $760_1$ to $760_K$. As discussed above, the enable gates can be implemented by OR gates for the p-code and AND gates for the n-code. The enabling is provided by the PCOMPEN and the NCOMPEN signals from the state machine 710. The drivers $760_1$ to $760_K$ are connected to the pads $770_1$ to $770_K$, respectively, to drive the corresponding buffers (not shown). The drivers $760_1$ to $760_K$ include p-devices $762_1$ to $762_K$ and n-devices $764_1$ to $764_K$. The p- and n-devices are mutually exclusively enabled.

The K up comparators $772_1$ to $772_K$, K down comparators $774_1$ to $774_K$, K up registers $782_1$ to $782_K$, and K down registers $784_1$ to $784_K$ are used in the same manner as described above. Each pair of comparators (e.g., $772_k$ and $774_k$) is connected to a corresponding pad $770_k$ to compare the pad voltage with the up and down reference voltages. Each pair of the registers (e.g., $782_k$ and $784_k$) is connected to the corresponding comparators (e.g., $772_k$ and $774_k$) to latch the comparison result to generate $LUP_k$ and $LDN_k$ signals. The state machine 710 uses the K signals $LUP_1$ to $LUP_K$ and $LDN_1$ to $LDN_K$ to adjust the corresponding up/down counters 720 and 730 accordingly as described above in connection with FIG. 3.

In this distributed RCOMP embodiment, the state machine 710 and the counters 720 and 730 are shared by the K pads $770_1$ to $770_K$. The comparators $772_1$ to $772_K$ and $774_1$ to $774_K$, and the registers $782_1$ to $782_K$ and $784_1$ to $784_K$ are separate to correspond to the pads $770_1$ to $770_K$ and associated buffers.

The K memory elements 715 store the p-codes and n-codes for the corresponding K buffer as generated by the counter 720 and 730. The K buffers associated with the K pads $770_1$ to $770_K$ are serially calibrated. Each buffer has its own PCODE and NCODE group. During calibration, the PCODE and NCODE for each group are latched in the corresponding memory elements of the K memory elements 715 while the calibration continues with the next group. The latched values are held and the interface buffers that correspond to these groups are updated with the values at an opportune time when the change will not affect the buffer operation.

Figure 8:
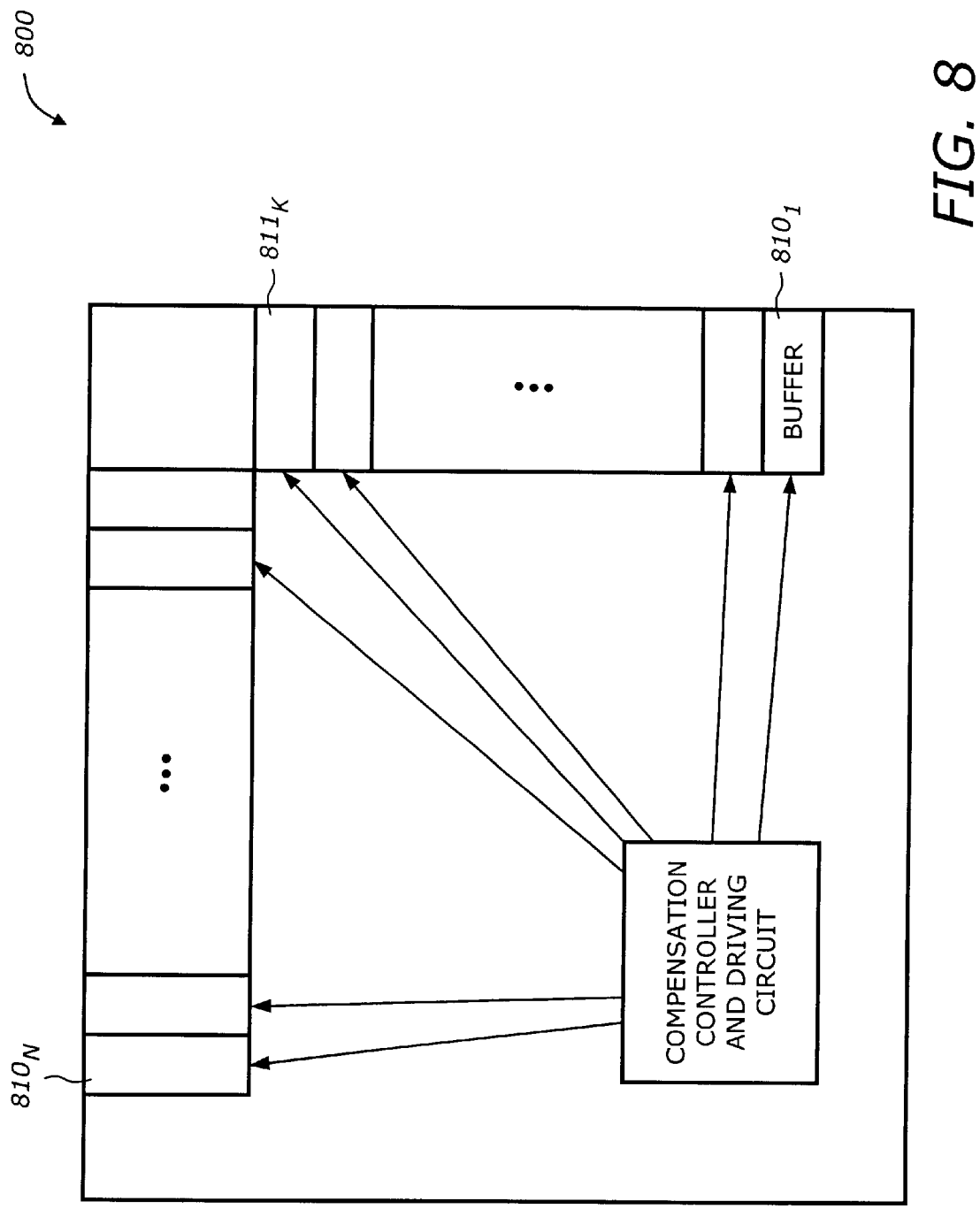
FIG. 8 is a diagram illustrating a device having a distributed RCOMP using normal buffers and pads according to one embodiment of the invention.

FIG. 8 is a diagram illustrating a device 800 having a distributed RCOMP using normal buffers and pads according to one embodiment of the invention. The device 800 includes N buffers $810_1$ to $810_N$.

The $810_1$ to $810_N$ are normal buffers. As mentioned above, in connection with FIG. 1, the technique works with systems that have external parallel termination and works especially well with CTT since only one RCOMP buffer is needed to calibrate both pull-up and pull-down. The device 800 has no dedicated RCOMP buffers. Each of the N buffers $810_1$ to $810_N$ serves as a RCOMP buffer. Since there are no dedicated RCOMP buffers, this embodiment saves pads, circuits, and other hardware overhead associated with the conventional RCOMP methodology.

The impedance control is performed using the compensation controller similar to that of FIG. 3 or FIG. 7. Since normal buffers are used, the compensation is performed at times that the bus is idle or not in use (i.e. refresh cycles for memory). There are three methods for the update. In the first method, the update is performed at reset. When the device is reset, either upon power up or at system reset, complete update is performed. This method is simple but the update may not be frequent enough to warrant suitable compensation. In the second method, the compensation code is updated incrementally and periodically at idle times. The idle times may be the refresh times of the DDR SDRAM. In the third method, the counters are shared by the multiple buffers. In this method, the update can be performed in a round-robin fashion for each of the buffers.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a scaler to generate a driver code from a compensation code according to a selector signal, the driver code corresponding to an impedance of a buffer;
   an enable circuit coupled to the scaler to enable the driver code; and
   a driver coupled to the enable circuit to control the impedance of the buffer according to the driver code.

2. The apparatus of claim 1 wherein the scaler comprises:
   a multiplexer array to generate N bits of the driver code from (N–P) bits of the compensation code, the multiplexer array scaling the compensation code according to the selector signal, the scaled compensation code corresponding to the driver code.

3. The apparatus of claim 1 wherein the impedance is one of first and second buffer impedances corresponding to heavily and lightly loaded buffers.

4. The apparatus of claim 3 wherein the driver code has one of first and second values corresponding to the first and second buffer impedances.

5. The apparatus of claim 4 wherein the multiplexer array comprises:
   N multiplexers each having K inputs to generate the N bits of the driver code from the (N–P) bits of the compensation code, the N multiplexers including least and most significant multiplexers corresponding to least and most significant bits of the (N–P) bits of the compensation code, the N multiplexers being controlled by the selector signal.

6. The apparatus of claim 5 wherein each of the N multiplexers has first and second inputs selected according to first and second levels of the selector signal, respectively, the second input of each of the multiplexers other than the most significant multiplexer being connected to the first input of a next significant multiplexer and to a corresponding bit of the compensation code, the first input of the least significant multiplexer and the second input of the most significant multiplexer being connected to a logic level to provide a scaling to the compensation code according to the selector signal.

7. The apparatus of claim 1 wherein the enable circuit generates a p-code and an n-code corresponding to p and n compensation codes, respectively, the p-code and the n-code being mutually exclusively enabled.

8. The apparatus of claim 7 wherein the driver comprises a plurality of p-devices to receive the p-code, the p-devices driving the buffer when the p-code is enabled.

9. The apparatus of claim 7 wherein the driver comprises a plurality of n-devices to receive the n-code, the n-devices driving the buffer when the n-code is enabled.

10. The apparatus of claim 1 wherein the compensation code is generated by a state machine in response to a feedback result from the buffer.

11. A method comprising:

generating a driver code from a compensation code according to a selector signal, the driver code corresponding to an impedance of a buffer;

enabling the driver code; and controlling the impedance of the buffer according to the driver code.

12. The method of claim 11 wherein generating the driver code comprises:

generating N bits of the driver code from (N−P) bits of the compensation code to scale the compensation code, the scaled compensation code corresponding to the driver code.

13. The method of claim 11 wherein the impedance is one of first and second buffer impedances corresponding to heavily and lightly loaded buffers.

14. The method of claim 13 wherein the driver code has one of first and second values corresponding to the first and second buffer impedances.

15. The method of claim 14 wherein generating the N bits of the driver code comprises:

generating N bits of the driver code from (N−P) bits of the compensation code by a multiplexer array having N multiplexers each having K inputs, the N multiplexers including least and most significant multiplexers corresponding to least and most significant bits of the (N−1) bits of the compensation code, the N multiplexers being controlled by the selector signal.

16. The method of claim 15 wherein each of the N multiplexers has first and second inputs selected according to first and second levels of the selector signal, respectively, the second input of each of the multiplexers other than the most significant multiplexer being connected to the first input of a next significant multiplexer and to a corresponding bit of the compensation code, the first input of the least significant multiplexer and the second input of the most significant multiplexer being connected to a logic level to provide a scaling to the compensation code according to the selector signal.

17. The method of claim 11 wherein enabling the driver code comprises generating a p-code and an n-code corresponding to p and n compensation codes, respectively, the p-code and the n-code being mutually exclusively enabled.

18. The method of claim 17 wherein controlling impedance of the buffer comprises driving the buffer by a plurality of p-devices when the p-code is enabled, the p-devices receiving the p-code.

19. The method of claim 17 wherein controlling impedance of the buffer comprises driving the buffer by a plurality of n-devices when the n-code is enabled, the n-devices receiving the n-code.

20. The method of claim 11 wherein the compensation code is generated by a state machine in response to a feedback result from the buffer.

21. A system comprising:

a compensation controller to generate a compensation code;

a buffer having an impedance matched to a loading; and a compensation driving circuit coupled to the compensation controller and the buffer to drive the buffer, the compensation driving comprising:

a scaler to generate a driver code from the compensation code according to a selector signal, the driver code corresponding to the impedance, an enable circuit coupled to the scaler to enable the driver code, and a driver coupled to the enable circuit to control the impedance of the buffer according to the driver code.

22. The system of claim 21 wherein the scaler comprises:

a multiplexer array to generate N bits of the driver code from (N−P) bits of the compensation code, the multiplexer array scaling the compensation code according to the selector signal, the scaled compensation code corresponding to the driver code.

23. The system of claim 21 wherein the impedance is one of first and second buffer impedances corresponding to heavily and lightly loaded buffers.

24. The system of claim 23 wherein the driver code has one of first and second values corresponding to the first and second buffer impedances.

25. The system of claim 24 wherein the multiplexer array comprises:

N multiplexers each having K inputs to generate N bits of the driver code from the (N−P) bits of the compensation code, the N multiplexers including least and most significant multiplexers corresponding to least and most significant bits of the (N−P) bits of the compensation code, the N multiplexers being controlled by the selector signal.

26. The system of claim 25 wherein each of the N multiplexers has first and second inputs selected according to first and second levels of the selector signal, respectively, the second input of each of the multiplexers other than the most significant multiplexer being connected to the first input of a next significant multiplexer and to a corresponding bit of the compensation code, the first input of the least significant multiplexer and the second input of the most significant multiplexer being connected to a logic level to provide a scaling to the compensation code according to the selector signal.

27. The system of claim 21 wherein the enable circuit generates a p-code and an n-code corresponding to p and n compensation codes, respectively, the p-code and the n-code being mutually exclusively enabled.

28. The system of claim 27 wherein the driver comprises a plurality of p-devices to receive the p-code, the p-devices driving the buffer when the p-code is enabled.

29. The system of claim 27 wherein the driver comprises a plurality of n-devices to receive the n-code, the n-devices driving the buffer when the n-code is enabled.

30. The system of claim 21 wherein the compensation code is generated by a state machine in response to a feedback result from the buffer.

* * * * *